United States Patent
Hwang

(10) Patent No.: US 8,488,404 B2
(45) Date of Patent: Jul. 16, 2013

(54) COUNTER CONTROL SIGNAL GENERATOR AND REFRESH CIRCUIT

(75) Inventor: Mi Hyun Hwang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 613 days.

(21) Appl. No.: 12/649,459

(22) Filed: Dec. 30, 2009

(65) Prior Publication Data

US 2010/0329060 A1    Dec. 30, 2010

(30) Foreign Application Priority Data

Jun. 26, 2009 (KR) .......................... 10-2009-0057628

(51) Int. Cl.
*G11C 7/00* (2006.01)
(52) U.S. Cl.
USPC ............................ 365/222; 365/236; 365/191
(58) Field of Classification Search
USPC ................... 365/222, 149, 183, 236
See application file for complete search history.

(56) References Cited

U.S. PATENT DOCUMENTS

| | | | |
|---|---|---|---|
| 6,912,169 B2 * | 6/2005 | Choi | 365/222 |
| 7,286,434 B2 | 10/2007 | Mori et al. | |
| 7,362,640 B2 * | 4/2008 | Oh | 365/222 |
| 7,929,369 B2 * | 4/2011 | Lee et al. | 365/222 |

FOREIGN PATENT DOCUMENTS

| | | |
|---|---|---|
| KR | 1019960015914 A | 5/1996 |
| KR | 1020040072260 A | 8/2004 |
| KR | 1020070036645 A | 4/2007 |

* cited by examiner

*Primary Examiner* — Kretelia Graham
(74) *Attorney, Agent, or Firm* — Ladas & Parry LLP

(57) ABSTRACT

A counter control signal generator comprises a first pulse signal generator configured to generate a first pulse signal including a pulse generated when a self-refresh period is terminated, a second pulse signal generator configured to generate a second pulse signal including a pulse generated in sync with a cyclic signal generated during a refresh period, and a signal generator configured to generate a counter control signal counting an address of a memory cell, corresponding to a memory cell on which a refresh operation is conducted, in response to the first and second pulse signals.

13 Claims, 4 Drawing Sheets

COUNTER CONTROL SIGNAL GENERATOR AND REFRESH CIRCUIT

CROSS-REFERENCES TO RELATED PATENT APPLICATION

The present application claims priority under 35 U.S.C 119(a) to Korean Application No. 10-2009-0057628, filed on Jun. 26, 2009, in the Korean Intellectual Property Office, which is incorporated herein by reference in its entirety as set forth in full.

BACKGROUND

An embodiment of the present invention relates to counter control signal generators and refresh circuits including the same.

As demand for mobile apparatuses including mobile telephone terminals, personal digital assistants (PDAs), etc increases, one area of interest is the reduction of the rate of power consumption through dynamic random access memories (DRAMs) employed in such mobile apparatuses. One particular area of interest is reducing refresh currents of mobile-specific DRAMs for lower power consumption thereof.

In contrast to static random access memories (SRAMs) or flash memories among semiconductor memories, DRAMs are characterized by losing data stored in memory cells over time, even while power is being supplied thereto. In order to retain data, DRAMs are basically accompanied with operations for rewriting the data from external systems in a period often called "refresh". Usually, such a refresh operation is carried out, in retention times that are inherent in memory cells of banks, by activating word lines at least once, or more, and sensing/amplifying data of the memory cells. Retention time is a time for which data can be maintained without a refresh operation after being written into a memory cell.

Several modes of refresh operations are known, e.g., an auto-refresh mode conducted in a normal operation and a self-refresh mode conducted in a power-down mode. The self-refresh operation is controlled by a self-refresh signal generated by a command decoder that receives a command signal. A self-refresh operation is illustrated in FIG. 1.

When a self-refresh signal SELF is activated to a high level in response to an input of a self-refresh command SREF CMD for the self-refresh operation, a self-refresh oscillator generates a pulse of a cyclic signal REF. At every pulse of the cyclic signal, a counter is enabled to sequentially count addresses for accessing memory cells to be refreshed. Thus, sequential steps of the refresh operation progress to the memory cells accessed by the counted addresses.

Here, as shown in FIG. 1, if the cyclic signal REF is generated in an incomplete pulse at a time X corresponding to the terminating the self-refresh operation, the self-refresh operation is inadvertently stopped by a transition of the self-refresh signal SELF to a low level and an address ADD is counted to '0000' from '0001'. Subsequently, while the address ADD continues to mechanically change from '0001' to '0010' upon the next generation of the pulse of the cyclic signal REF, if an auto-refresh command AREF is input at a time Y, a refresh fail would be caused due to the incomplete transaction of the prior refresh operation step to the memory cell of the address '0001'.

SUMMARY

Accordingly, exemplary embodiments are directed to a counter control signal generator, a refresh circuit including the same as well, capable of substantially preventing a refresh fail that arises from incomplete generation of a pulse of a cyclic signal when a self-refresh operation is terminated, by conducting a refresh operation to a memory cell array accessed by the address from termination of the self-refresh operation until an input of a cyclic signal used for the next refresh operation.

In accordance with an aspect of the present invention, there is provided a counter control signal generator may comprising a first pulse signal generator configured to generate a first pulse signal including a pulse generated when a self-refresh period is terminated; a second pulse signal generator configured to generate a second pulse signal including a pulse generated in sync with a cyclic signal generated during a refresh period; and a signal generator configured to generate a counter control signal counting an address of a memory cell, to which a refresh operation is conducted, in response to the first and second pulse signals.

In accordance with another aspect of the present invention, there is provided a refresh circuit may comprising a counter control signal generator configured to generate a counter control signal in response to a self-refresh signal, which is activated in a self-refresh period, and a cyclic signal generated in a refresh period, a counter configured to output an address counting signal in response to the counter control signal; and an address output circuit configured to output an address of a memory cell, to which a refresh operation is conducted, from the address counting signal.

A further understanding of the nature and advantages of the present invention herein may be realized by reference to the remaining portions of the specification and the attached drawings.

BRIEF DESCRIPTION OF THE DRAWINGS

The above and other aspects, features and other advantages will be more clearly understood from the following detailed description taken in conjunction with the accompanying drawings, in which.

DESCRIPTION OF EMBODIMENTS

Hereinafter, various exemplary embodiments will now be described more fully with reference to the accompanying drawings in which some exemplary embodiments are shown. However, specific structural and functional details disclosed herein are merely representative for purposes of describing exemplary embodiments of the present invention. Like numbers refer to like elements throughout the description of the drawings.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Further, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the invention.

In order to more specifically describe exemplary embodiments, various aspects will be hereinafter described in detail with reference to the attached drawings.

Figure 1:
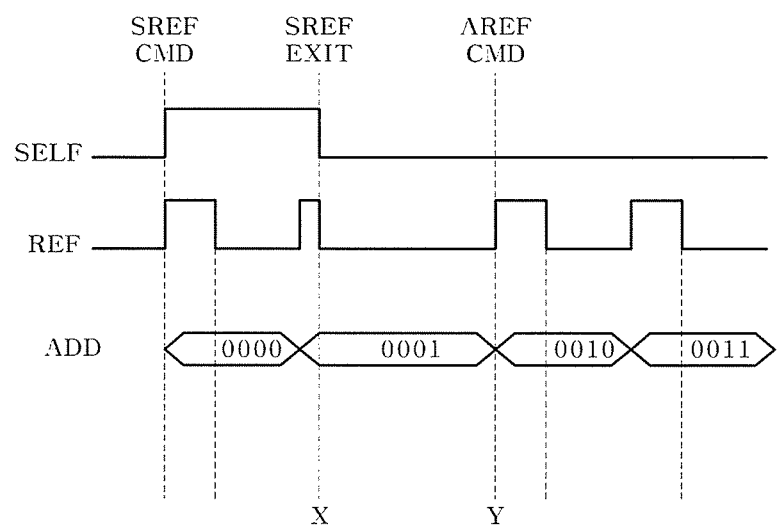
FIG. 1 is a timing diagram showing a general self-refresh operation.
Figure 2:
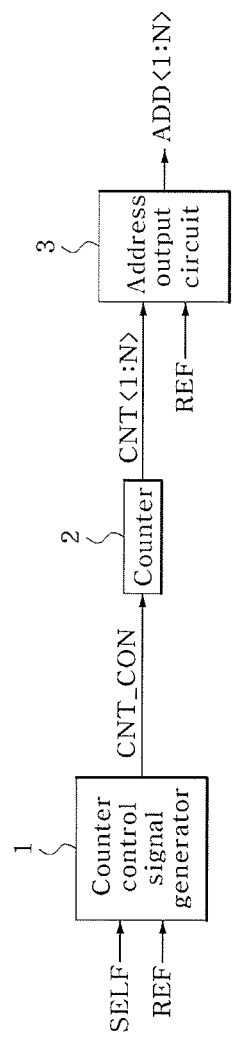
FIG. 2 is a block diagram of a refresh circuit according an embodiment of the present invention.
Figure 3:
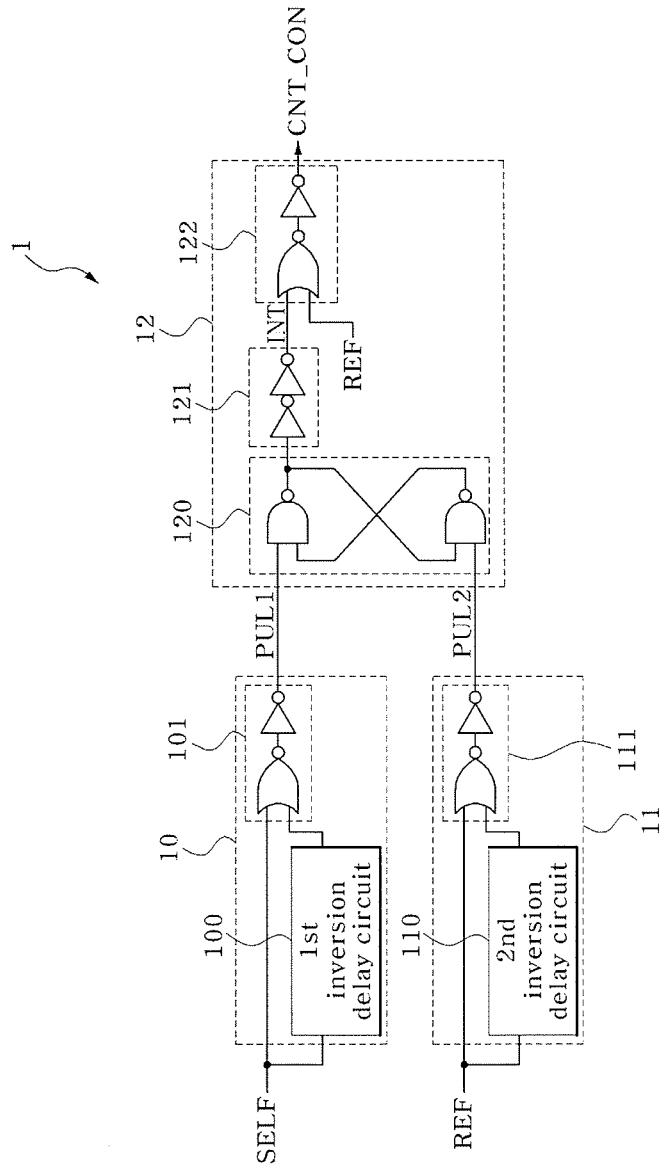
FIG. 3 is a circuit diagram showing a counter control signal generator of the refresh circuit shown in FIG. 1 according to an embodiment of the present invention.

FIG. 2 is a block diagram showing a block diagram of a refresh circuit according an embodiment of the present invention, and FIG. 3 is a circuit diagram shown for illustrating the counter control signal generator included in the refresh circuit shown in FIG. 1.

Referring to FIG. 2, the refresh circuit may be comprised of a counter control signal generator 1, a counter 2, and an address output circuit 3. The counter 2 increments an address counting signal CNT<1:N> by 1 bit when a counter control signal CNT_CON is a high level pulse. The address output circuit 3 supplies the address counting signals CNT<1:N> to a memory cell array, in which the refresh operation is carried out, as address signals ADD<1:N> for each high level pulse of the cyclic signal REF.

Referring to FIG. 3, according to an embodiment of the present invention, the counter signal generator 1 is comprised of a first pulse signal generator 10, a second pulse signal generator 11, and a signal generator 12.

As shown in FIG. 3, according to an embodiment of the present invention the first pulse signal generator 10 includes a first inversion delay circuit 100 inversely delaying a self-refresh signal SELF, and a first logic circuit 101 generating a first pulse signal PUL1 through an OR operation with the self-refresh signal SELF and an output signal of the inversion delay circuit 100. The self-refresh signal SELF is active at a high level during a self-refresh period. With this configuration, the first pulse signal generator 10 operates to generate the first pulse signal PUL1 including a pulse that is active upon the transitioning of the self-refresh signal SELF to a low level from a high level for a delay period of the first inversion delay circuit 100.

As shown in FIG. 3, according to an embodiment of the present invention the second pulse signal generator 11 includes a second inversion delay circuit 110 inversely delaying a cyclic signal REF, and a second logic circuit 111 generating a second pulse signal PUL2 through an OR operation with the cyclic signal REF and an output signal of the second inversion delay circuit 110. The cyclic signal REF includes pulses that are periodically generated during the refresh period (including the self-refresh period and an auto-refresh period). With this configuration, the second pulse signal generator 11 operates to generate the second pulse signal PUL2 from when the pulse of the cyclic signal REF is applied, i.e., in sync with a falling edge of the pulse of the cyclic signal REF (a time point at which the cyclic signal REF transitions to a low level from a high level), for a delay period of the second inversion delay circuit 110.

Figure 4:
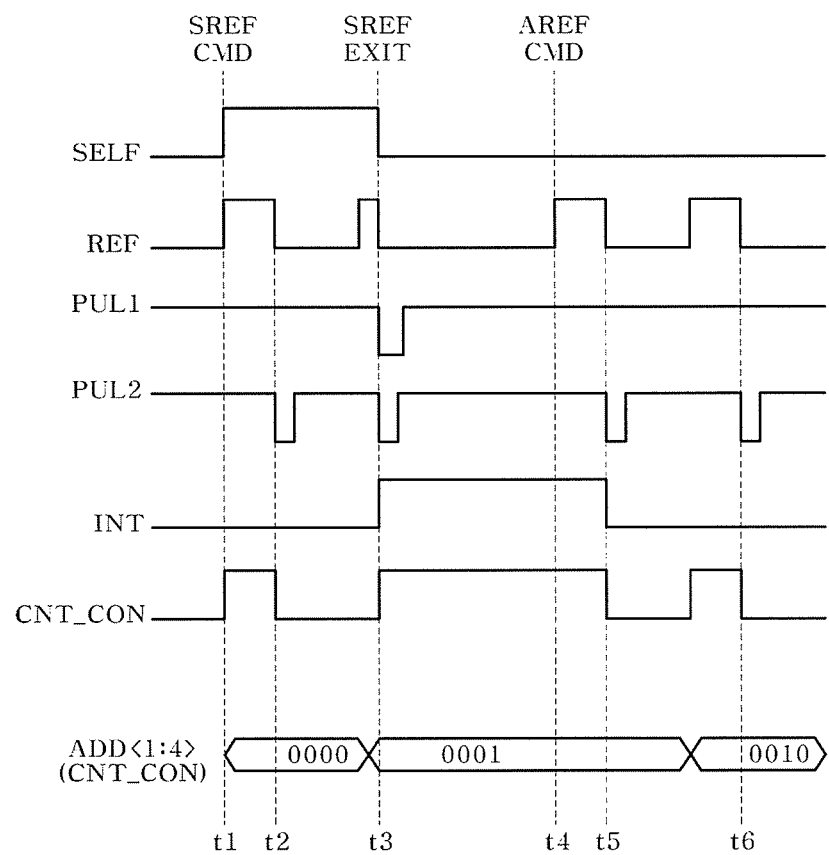
FIG. 4 is a timing diagram shown for illustrating an operation principle of the counter control signal generator shown in FIG. 2 according to an embodiment of the present invention.

As shown in FIG. 3, according to an embodiment of the present invention the signal generator 12 includes a latch 120, a buffer 121, and a third logic circuit 122. The latch 120 includes an SR latch (S: set, R: reset) receiving the first pulse signal PUL1 as a set signal and receiving the second pulse signal PUL2 as a reset signal. The buffer 121 generates an internal signal INT by buffering an output signal of the latch 120. The third logic circuit 122 receives the internal signal INT and the cyclic signal REF and outputs a counter control signal CNT_CON. As shown in FIGS. 3 and 4, the signal generator 12 generates the counter control signal CNT_CON to be activated at a high level in response to either a high level pulse of the internal signal INT or a high level pulse the cyclic signal REF.

The operation of the counter control signal generator 1 in conjunction with FIG. 4 will be described hereinbelow. FIG. 4 is shown for an address having four bits, although it should be clearly understood that the number of bits being equal to four is by way of example only, and the present invention is in no way limited hereto.

When a self-refresh command SREF CMD is input at a time t1, a self-refresh signal SREF is activated to a high level. When a self-refresh exit command SREF EXIT is input at a time t3, the self-refresh signal SREF is inactivated to a low level.

While the self-refresh signal SREF is maintained at a high level, i.e., during the time period t1~t3, a self-refresh oscillator (not shown) generates the cyclic signal REF. At this time, the counter control signal generator 1 operates to substantially prevent a refresh fail. That is, as shown in FIG. 4, when the pulse of the cyclic signal REF is not completely generated by the self-refresh exit command, the control signal generator 1 operates to substantially prevent a refresh fail.

More specifically, the first pulse signal generator 10 outputs the first pulse signal PUL1 with a pulse that is active in a low level when the self-refresh signal SREF transitions to a low level from a high level for the delay period of the inversion delay circuit 100. That is, the first pulse signal generator 10 outputs the first pulse PUL1 with a pulse that is active in a low level from the time t3 at which the self-refresh period is terminated for the delay period of the inversion delay circuit 100. That is, the low level activated pulse of the first pulse signal PUL1 is generated at the time t3.

At this time, the second pulse signal generator 11 outputs the second pulse signal PUL2 having a pulse that is active in a low level in sync with a falling edge of the pulse of the cyclic signal REF for the delay period of the inversion delay circuit 110. Accordingly, the low level activated pulses of the second pulse signal PUL2 are generated at the times t2, t3, t5 and t6 as shown in FIG. 4.

Subsequently, the latch 120 receives and holds the first pulse signal PUL1 as the set signal and the second pulse signal PUL2 as the reset signal. In further detail, when the low level pulses of the first and second pulse signals PUL1 and PUL2 are input at the same time, the latch 120 outputs a high level signal. Here, the high level state of the output signal from the counter control signal CNT_CON is maintained until the next subsequent generation of a low level pulse of the second pulse signal PUL2. That is, when the second pulse signal PUL2 is generated at a low level in response to an auto-refresh command AREF CMD, the output signal of the latch 120 transitions to a low level from a high level. Thus, the buffer 121 receiving the output signal of the latch 120 generates the internal signal INT that is maintained at a high level from the time both the first and second pulse signals PUL1, PUL2 transition to a low level until the time t5 when the pulse signal PUL2 transitions to a low level again.

The third logic circuit 122 generates the counter control signal CNT_CON that is activated to a high level if either the cyclic signal or the internal signal INT is activated in a high level. Thus, the counter control signal CNT_CON maintains an active state of a high level from the time t3 until the time t5.

According to embodiments of the present invention, as described above, the counter control signal generator 1 generates the counter control signal CNT_CON which substantially maintains an active state of a high level from the time t3 at which the self-refresh period is terminated, until the time t5 at which the low level pulse of the second pulse signal PUL2 is generated by a new stage of the refresh operation. Thereby, as the counter control signal CNT_CON is active in a high level from the time t3 until the time t5, the counter 2 stops counting after generating the counting signals CNT<1:4> from the time t3, and the address signals ADD<1:4> supplied from the address output circuit 3 are held on '0001' without change from the t3 until the time t5. Accordingly, from a time t4 when the refresh operation is enabled by the auto-refresh command AREF CMD is conducted from a memory cell accessed by the address signals ADD<1:4>. In other words, even though a refresh operation to a memory cell accessed by the address signals ADD<1:4> of '0001' is not completely terminated, the refresh operation can be completed without a refresh fail because the address signals ADD<1:4> of '0001' are regenerated in the next stage of the refresh operation.

The foregoing description is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this invention as defined in the claims.

What is claimed is:

1. A counter control signal generator, comprising:
 a first pulse signal generator configured to generate a first pulse signal, a pulse of the first pulse signal generated when a self-refresh period is terminated;
 a second pulse signal generator configured to generate a second pulse signal, a pulse of the second pulse signal generated in sync with a cyclic signal generated during a refresh period; and
 a signal generator configured to generate a counter control signal counting an address of a memory cell, corresponding to a memory cell on which a refresh operation is conducted, in response to the first and second pulse signals, wherein the pulse of the second pulse signal is activated upon inactivation of the cyclic signal for a delay period, wherein the second pulse signal generator comprises a second inversion delay circuit configured to inversely delay the cyclic signal for the delay period; and
 a second logic circuit configured to logically combine the cyclic signal and an output signal of the second inversion delay circuit to generate the second pulse signal.

2. The counter control signal generator according to claim 1, wherein the first pulse signal generator comprises:
 a first inversion delay circuit configured to inversely delay a self-refresh signal; and
 a first logic circuit configured to logically combine the self-refresh signal and an output of the first inversion delay circuit to generate the first pulse signal.

3. The counter control signal generator according to claim 2, wherein the pulse of the first pulse signal is activated upon inactivation of the self-refresh signal for a delay period of the first inversion delay circuit.

4. The counter control signal generator according to claim 1, wherein the signal generator comprises:
 a latch configured to generate an output signal activated in response to the first pulse signal and inactivated in response to the second pulse signal;
 a buffer configured to buffer the output signal of the latch; and
 a third logic circuit configured to logically combine an output signal of the buffer and the cyclic signal to output the counter control signal.

5. The counter control signal generator according to claim 4, wherein the latch is an SR latch receiving the first pulse signal as a set signal and receiving the second pulse signal as a reset signal.

6. The counter control signal generator according to claim 4, wherein the third logic circuit activates and outputs the counter control signal when at least one of a pulse of the cyclic signal and the output signal of the buffer is activated.

7. A refresh circuit, comprising:
 a counter control signal generator configured to generate a counter control signal in response to a self-refresh signal activated in a self-refresh period and a cyclic signal generated in a refresh period;
 a counter configured to output an address counting signal in response to the counter control signal; and
 an address output circuit configured to output an address of a memory cell, corresponding to a memory cell on which a refresh operation is conducted, from the address counting signal,
 wherein the counter control signal generator comprises a first pulse signal generator configured to generate a first pulse signal, a pulse of the first pulse signal generated when the self-refresh period is terminated, a second pulse signal generator configured to generate a second pulse signal, a pulse of the second pulse signal generated in sync with the cyclic signal, and a signal generator configured to generate the counter control signal in response to the first and second pulse signals, and the pulse of the second pulse signal is activated upon inactivation of the cyclic signal for a delay period.

8. The refresh circuit according to claim 7, wherein the first pulse signal generator comprises:
 a first inversion delay circuit configured to inversely delay the self-refresh signal; and
 a first logic circuit configured to logically combine the self-refresh signal and an output of the first inversion delay circuit to generate the first pulse signal.

9. The refresh circuit according to claim 8, wherein the pulse of the first pulse signal is activated upon inactivation of the self-refresh signal for a delay period of the first inversion delay circuit.

10. The refresh circuit according to claim 7, wherein the second pulse signal generator comprises:
 a second inversion delay circuit configured to inversely delay the cyclic signal for the delay period; and
 a second logic circuit configured to logically combine the cyclic signal and an output signal of the second inversion delay circuit to generate the second pulse signal.

11. The refresh circuit according to claim 7, wherein the signal generator comprises:
 a latch configured to generate an output signal activated in response to the first pulse signal and inactivated in response to the second pulse signal;
 a buffer configured to buffer the output signal of the latch; and
 a third logic circuit configured to logically combine an output signal of the buffer and the cyclic signal to output the counter control signal.

12. The refresh circuit according to claim 11, wherein the latch is an SR latch receiving the first pulse signal as a set signal and receiving the second pulse signal as a reset signal.

13. The refresh circuit according to claim 11, wherein the third logic circuit activates and outputs the counter control signal when at least one of a pulse of the cyclic signal and the output signal of the buffer is activated.

* * * * *